(12) United States Patent
Tan (10) Patent No.: US 9,128,385 B2
(45) Date of Patent: Sep. 8, 2015

(54) ADAPTIVE PHOTOMASKS AND METHODS FOR USING THE SAME

(71) Applicant: Apple Inc., Cupertino, CA (US)

(72) Inventor: Napthaneal Yuen Tan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 46 days.

(21) Appl. No.: 13/970,534

(22) Filed: Aug. 19, 2013

(65) Prior Publication Data

US 2015/0049324 A1    Feb. 19, 2015

(51) Int. Cl.
*G03F 1/50* (2012.01)
*G03F 7/20* (2006.01)
*G03F 1/36* (2012.01)
*G03F 1/22* (2012.01)

(52) U.S. Cl.
CPC .. *G03F 1/50* (2013.01); *G03F 1/22* (2013.01); *G03F 1/36* (2013.01); *G03F 7/2045* (2013.01); *G03F 7/70291* (2013.01)

(58) Field of Classification Search
CPC ............... G03F 1/22; G03F 1/36; G03F 1/50; G03F 7/2045; G03F 7/70291
USPC ................................ 430/5, 22, 30
See application file for complete search history.

(56) References Cited

U.S. PATENT DOCUMENTS

| | | | |
|---|---|---|---|
| 6,251,550 B1 * | 6/2001 | Ishikawa | 430/22 |
| 6,879,376 B2 | 4/2005 | Case et al. | |
| 7,088,432 B2 | 8/2006 | Zhang | |
| 7,125,651 B2 | 10/2006 | Hasegawa et al. | |
| 8,512,919 B2 | 8/2013 | Fujimura et al. | |

FOREIGN PATENT DOCUMENTS

WO    WO9600422    1/1996

* cited by examiner

*Primary Examiner* — Christopher Young
(74) *Attorney, Agent, or Firm* — Downey Brand LLP

(57) ABSTRACT

The embodiments described herein relate to methods, devices, and systems for masking a substrate using a photomasking process. An adaptive photomask configured to generate a photomasking pattern in accordance with dimensions of a surface feature on substrate is described. The adaptive photomask can be used to create customized photomask patterns for individual substrates. Methods and devices described herein can be used in manufacturing processes where similar parts having slight differences due to built-in tolerances are manufactured. Methods and a devices described herein can also be used in manufacture processes involving masking of three-dimensional portions of a part. A photomasking system that includes a translational mechanism for scanning a substrate surface is described.

22 Claims, 12 Drawing Sheets

ADAPTIVE PHOTOMASKS AND METHODS FOR USING THE SAME

FIELD OF THE DESCRIBED EMBODIMENTS

The described embodiments relate generally to photomasks and photomasking techniques used in the manufacture of consumer products. More specifically, photomasks and photomasking techniques that accommodate for tolerances accumulated during manufacture of consumer products are described.

BACKGROUND

Photomasks are generally opaque plates with holes or transparencies that allow light to shine through in a defined pattern. They are commonly used in photoengraving and surface finishing processes to transfer a geometric pattern of light onto a light-sensitive chemical photoresist on a substrate surface. The substrate is then chemically treated to remove portions of the photoresist either exposed to light or not exposed to light, depending on the type of photoresist that is used. The patterned photoresist remaining on the surface of the substrate can then act as a mask during any of a number of surface treatment procedures, such as deposition, etching or blasting processes. After the photoresist is removed, the substrate surface is left with a pattern of treated and untreated regions.

In some cases, the substrate surfaces can include one or more surface features, such as designs and inlays. In some cases the features can be positioned on corners and edges. These surface features have borders that define the surface features. In a manufacturing environment where multiple similar parts are produced, the dimensions of the features can vary from part to part due to built-in tolerances of the manufacturing process. However, in traditional photomasking techniques the pattern imprinted on the photomask is fixed and does not accommodate any dimensional differenced of the features due to the manufacturing tolerances. This can ultimately lead to parts with surfaces having patterns of treated and untreated regions that mismatch the borders of the surface features. These mismatched borders can be noticeably cosmetically unappealing, especially if they are on exterior surfaces of a consumer product.

SUMMARY

This paper describes various embodiments that relate to photomasking a substrate. The photomasking procedure can take place prior to a photoengraving, photoetching or other surface treatment procedure. Methods described are useful for providing custom photomask patterns for a single part or a series of parts manufactured in a manufacturing line.

According to one embodiment, a method for using a configurable aperture to dynamically activate a corresponding portion of a photoresist layer disposed on a surface of a substrate and associated with at least one surface feature is described. The method involves receiving a set of dimensional data associated with the at least one surface feature. The dimensional data includes data corresponding to a boundary of the at least one surface feature. The method also involves adjusting a size and shape of a transmissive portion of the configurable aperture in accordance with the received dimensional data. The transmissive portion allows energy used to activate the corresponding portion of the photoresist layer to pass.

According to another embodiment, a method for using an adaptive photomask to dynamically activate a portion of a first photoresist layer disposed on a first part and a second photoresist layer disposed on a second part is described. The first part has a first surface feature and the second part has a second surface feature. The method includes receiving a first set of dimensional data associated with the first feature. The first set of dimensional data includes data corresponding to a first feature boundary of the first feature. The method also includes adjusting a size and shape of a transmissive portion of the adaptive photomask in accordance with the received first set of dimensional data. The transmissive portion allows energy used to activate a portion of the photoresist layer corresponding to the first feature to pass. The method also includes receiving a second set of dimensional data associated with the second feature. The second set of dimensional data including data corresponding to a second feature boundary of the second feature, where the second set of dimensional data is different than the first set of dimensional data. The method also includes adjusting a size and shape of the transmissive portion of the adaptive photomask in accordance with the received second set of dimensional data. The transmissive portion allows energy used to activate a portion of the photoresist layer corresponding to the second feature to pass.

According to an additional embodiment, an adaptive photomask configured to dynamically generate a number of different photomask patterns based on a number of features on at least one substrate surface is described. The adaptive photomask includes a changeable medium having a number of selectively transmissive elements. When in a transmissive state, each of the selectively transmissive elements allows light to passes therethrough to activate a corresponding portion of a photoresist layer disposed on the at least one substrate. The changeable medium is configured to receive a first set of dimensional data associated with a boundary of a first surface feature and a second set of dimensional data associated with a boundary of second surface feature, where the first set is different from the second set. The changeable medium is also configured to form a first photomask pattern by causing a first group of the selectively transmissive elements to become transmissive in accordance with the received first set of dimensional data. The changeable medium is also configured to form a second photomask pattern different from the first pattern by causing a second group of selectively transmissive elements to become transmissive in accordance with the received second set of dimensional data.

BRIEF DESCRIPTION OF THE DRAWINGS

The described embodiments and the advantages thereof may be better understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION OF SELECTED EMBODIMENTS

The following disclosure describes various embodiments of photomasks and methods for using photomasks. Certain details are set forth in the following description and Figures to provide a thorough understanding of various embodiments of the present technology. Moreover, various features, structures, and/or characteristics of the present technology can be combined in other suitable structures and environments. In other instances, well-known structures, materials, operations, and/or systems are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods, components, and so forth.

The embodiments described herein relate to methods, systems, and devices for masking portions of a surface of a substrate. The methods involve the use of photomasks, which generally have patterns of opaque and transparent regions corresponding to a pattern of light or other energy that a photoresist layer disposed on a substrate surface will be exposed to. The opaque regions allow light, typically ultraviolet (UV) light, to pass through to the photoresist layer. The opaque regions substantially block the passage of light from reaching the photoresist layer. In described embodiments, an adaptive photomask capable of generating a custom pattern of opaque and transparent portions is described.

Figure 1A:
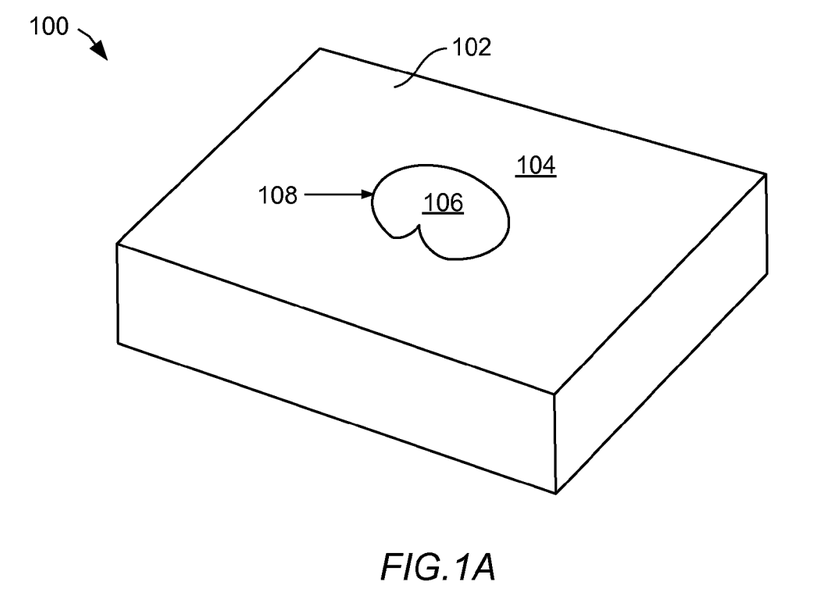
FIGS. 1A-1F illustrate perspective views of a part having a surface feature undergoing photoresist, photomasking, and texturing processes.

FIGS. 1A-1F illustrate prospective views of part 100 undergoing a photomasking process, as well as a texturing process. FIG. 1A shows part 100 with surface 102 having a surface feature 106 within surrounding surface portion 104. Boundary 108 defines the dimensions of surface feature 106, including its size, shape and position within surrounding surface portion 104. In some embodiments, surface feature 106 is a design, such as an inlay. In some embodiments, surface feature 106 is made of a different material than surrounding surface portion 104. For example, surface feature 106 can be made of a plastic or ceramic material and surrounding surface portion 104 can be made of a metal material. In other embodiments, surface feature 106 and surrounding surface portion 104 are made of the same material. In some embodiments, surface feature 106 rises above or recesses within surrounding surface portion 104.

The photomasking process described herein can be used to treat one or both of surrounding surface portion 104 and surface feature 106 to have different surface qualities. To accomplish different surface qualities, one of surrounding surface portion 104 and surface feature 106 is masked using a photoresist material to protect it from exposure to a particular surface treatment process. In the embodiments shown in FIGS. 1A-1F, the surface feature 106 is masked while surrounding surface portion 104 is unmasked during a texturing process. In one embodiment, prior to photomasking, surrounding surface portion 104 and surface feature 106 are treated to have a certain surface quality. For example, surrounding surface portion 104 and surface feature 106 can be polished to have a shiny finish.

Figure 1B:
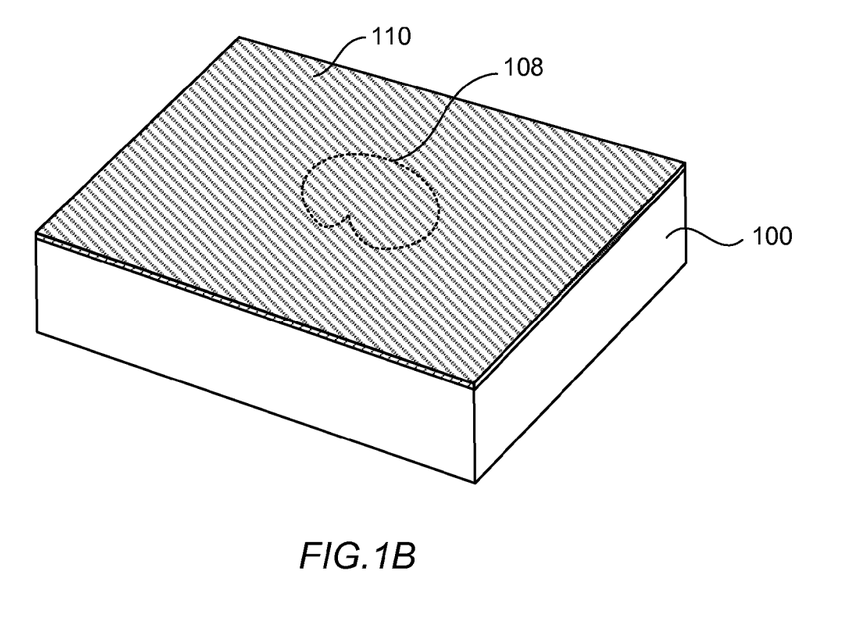

At FIG. 1B, photoresist 110 is applied over part 100 covering both surrounding surface portion 104 and surface feature 106. In some embodiments, photoresist 110 is a light sensitive polymer material that can be initially applied in liquid form. In some embodiments, photoresist 110 is sensitive to other forms of energy such as energy from an e-beam. Photoresist 110 can be applied using any suitable technique such as spin-on or spray-on techniques to form a thin layer of photoresist material. In one embodiment, photoresist 110 is substantially transparent or translucent such that boundary 108 is visible from a top surface of part 100.

Figure 1C:
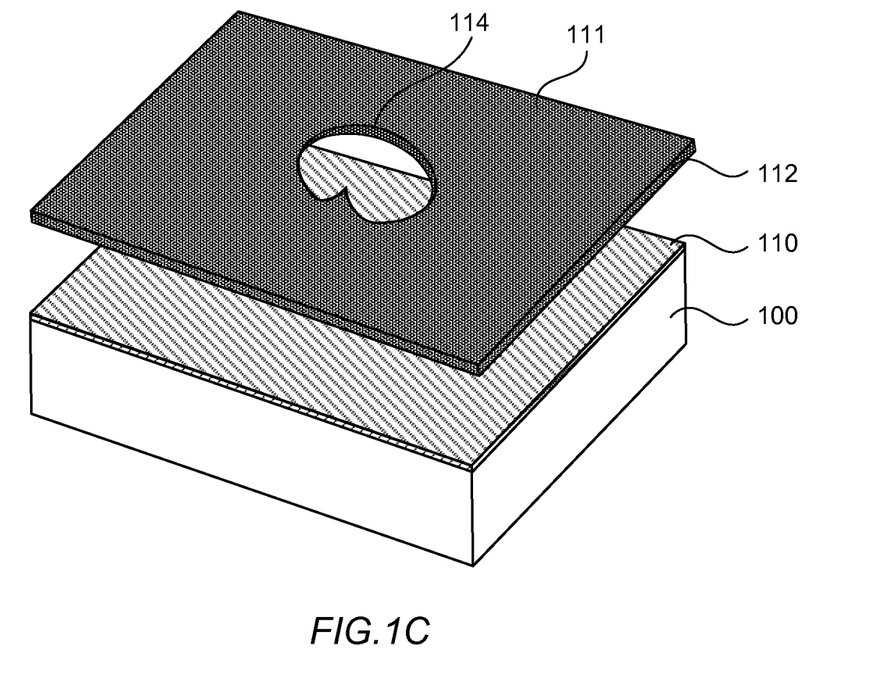
Figure 1D:
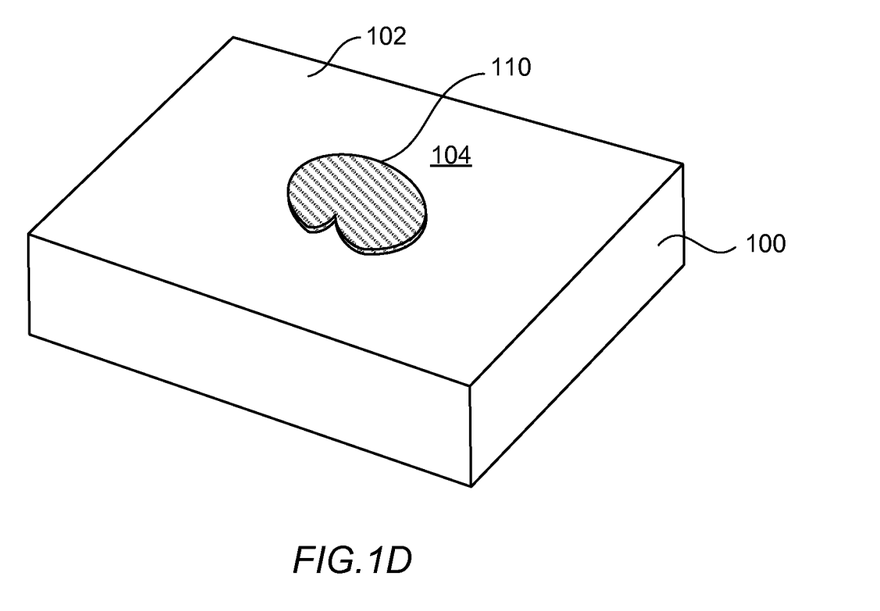
Figure 1E:
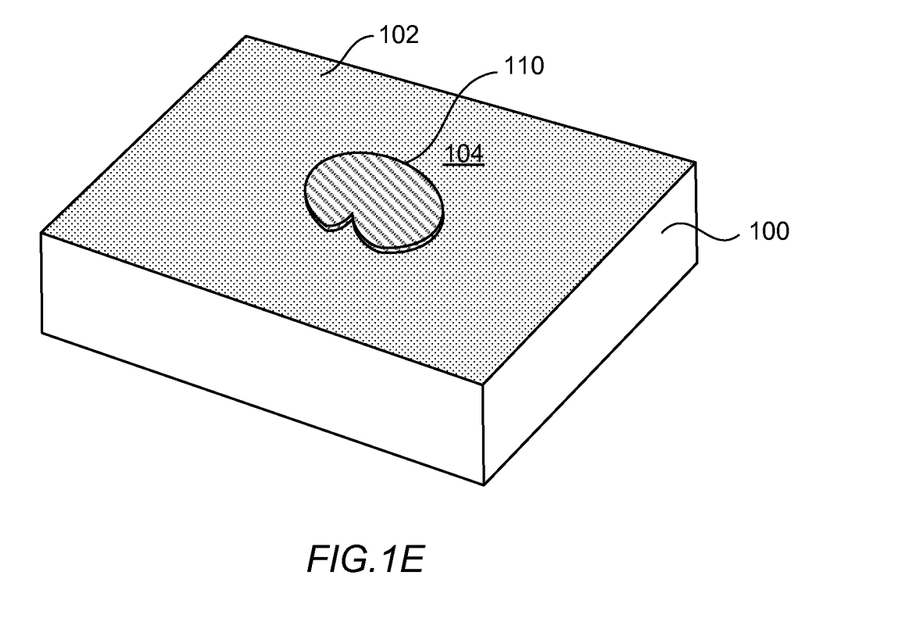
Figure 1F:
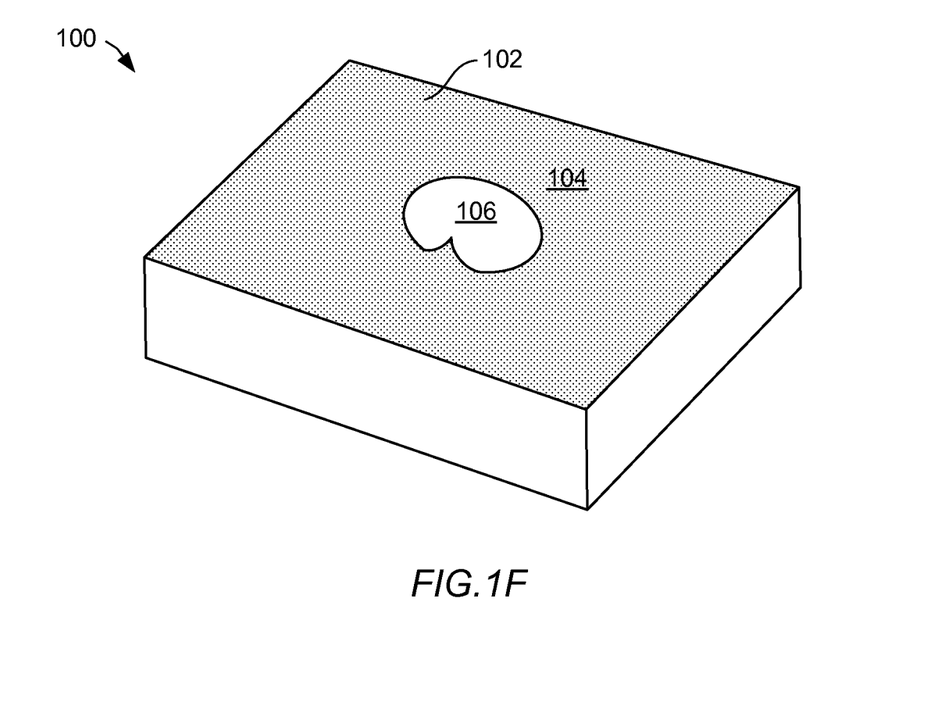

At FIG. 1C, photomask 112 is positioned a distance above photoresist 110 and part 100. Photomask 112 has a transmissive portion 114 having a shape corresponding to surface feature 106. During a photoresist activating or curing process, light passes through transmissive portion 114 to expose and activate the portion of photoresist 110 corresponding to the shape of surface feature 106. Transmissive portion 114 can be in the form of an opening or can be in the form of a transparent portion of photomask 112. Opaque portion 111 of photomask 112 substantially blocks the passage of light or other energy from reaching photoresist 110 and part 100. In some embodiments, photomask 112 is designed to block and allow passage of UV light. At FIG. 1D, photoresist 110 is chemically treated to remove portions of photoresist 110 covering surrounding surface portion 104. Since photoresist 110 covering surface feature 106 has been activated, this portion remains after the chemical treatment. At FIG. 1E, part 100 undergoes a texturing process, such as an etching or blasting process. As a result, surrounding surface portion 104 takes on a different surface quality in accordance with the surface texturing process. Surface feature 106 is covered by and protected by photoresist 110, and therefore is not exposed to the surface treatment. At FIG. 1F, photoresist 110 is removed leaving surrounding surface portion 104 and surface feature 106 with different surface qualities.

Embodiments described herein relate to photomasks, such as photomask 112, and methods for using photomasks. In embodiments described herein, the patterns of transmissive and opaque regions within the photomasks can be customized to have a shape in accordance with particular features on the substrate. The embodiments described are well suited for a manufacturing environment where multiple similar parts are created. The photomasks can be customized to accommodate for differences between individual parts due to manufacturing tolerances. For example, during the manufacture of part 100, the dimensions of surface feature 106 can be different than a corresponding surface feature of another part using the same manufacturing process. These differences can be due to tolerances built into the manufacturing process. Thus, the dimensions of feature boundary 108 can differ slightly from part to part. Traditional photomasking techniques involve using a photomask having a fixed pattern of transparent and opaque regions. The use of a fixed pattern photomask can result in variability of the position of boundary of the textured portion with respect to the feature boundary. In the case of part 100, for example, regions of surrounding surface portion 104 can become masked, and thereby not be exposed to the texturing process, and regions of surface feature 106 can be unmasked, and thereby be exposed to the texturing process. The result is the boundary of the textured portion does not overlap consistently with feature boundary 108. If surface feature 106 is a feature that has an irregular or non-linear geometry, such as a spline curve, it manufacturing tolerances can be greater, leading to even more dimensional variability from part to part.

Embodiments herein describe an adaptive photomask that can be used to create a customized photomask pattern for each part. The customized photomask pattern can be generated in accordance with existing surface features of the part. For example, referring back to FIG. 1, an adaptive photomask can be used to create a customized photomask pattern to form textured surfaces on part 100 with boundaries that match with corresponding feature boundaries 108. Since the photomask patterns are customized for each part, the photomask takes into account part-to-part differences associated with built-in tolerances of the manufacturing process. The result is consistently aligned and cosmically appealing boundaries between masked and unmasked portion of the part.

Figure 2A:
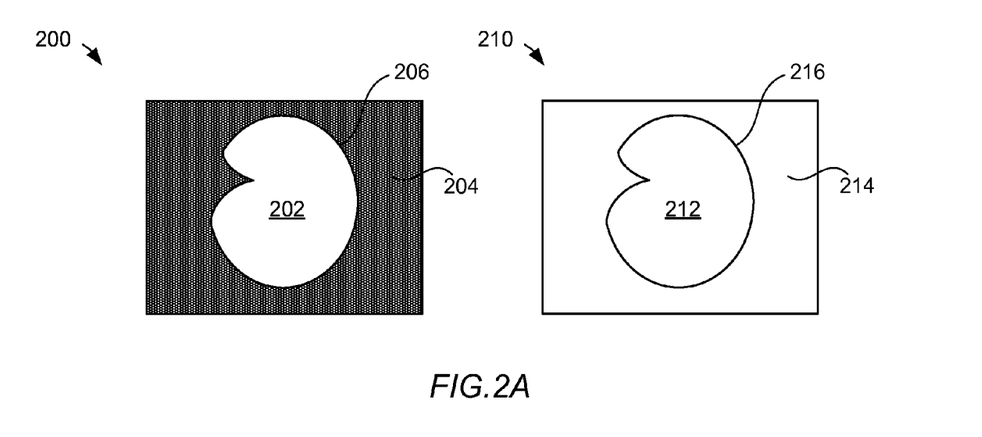
FIGS. 2A and 2B illustrate top views of an adaptive photomask with two different parts.
Figure 2B:
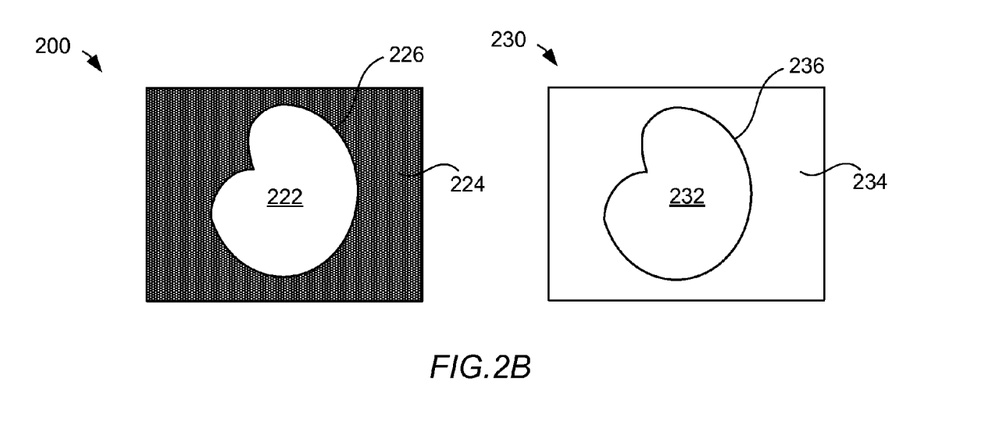

FIGS. 2A and 2B show top views of adaptive photomask 200, along with two different parts 210 and 230, in accordance with described embodiments. At FIG. 2A, adaptive photomask 200 is at a first state for photomasking first part 210. At FIG. 2B, adaptive photomask 200 is at a second state for photomasking second part 230. First part 210 and second part 230 can be two similar parts produced in a manufacturing process. First part 210 and second part 230 have similar but differently shaped features 212 and 232 within surrounding surfaces 214 and 234, respectively. Feature boundaries 216 and 236 define the shapes and sizes of features 212 and 232, respectively. In one embodiment, features 212 and 232 are made of the same material as surrounding surfaces 214 and 234, respectively. In one embodiment, features 212 and 232 are made of the different material than surrounding surfaces 214 and 234, respectively. Features 212 and 232 can be recessed, protruded or flush with surrounding surfaces 214 and 234, respectively.

As shown, feature 212 of part 210 has a slightly different dimensions compared to feature 232 of part 230. These differences can be due to manufacturing variations, i.e. manufacturing or engineering tolerances. At FIG. 2A, photomask 200 is at a first state with transmissive portion 202 corresponding to feature 212 of part 210. At FIG. 2B, photomask 200 is at a second state with transmissive portion 222 corresponding to feature 232 of part 230. Transmissive portions 202 and 222 of photomask 200 are configured to allow energy such as light to pass therethrough and opaque portions 204 and 224 are configured to substantially block the passage of energy such as light. Photomask feature boundaries 206 and 226 define the shapes and sizes of transparent portions 202 and 222, respectively. As described above with reference to FIGS. 1A-1F, energy passing through transparent portions 202 and 222 can impinge on layers of photoresist (not shown) formed over parts 210 and 230. Note that photomask 200 can be designed to block and let through any suitable wavelengths of light during a photomasking process. In some embodiments, photomask 200 is designed to block and let through UV wavelengths of light. The unexposed photoresist corresponding to surrounding surfaces 214 and 234 can then be removed, leaving a photoresist mask over features 212 and 232. Note that FIGS. 2A and 2B are presented as examples of a photomask in accordance with described embodiments and are not meant to represent all possible embodiments. For instance, other embodiments can include photomasks where the transparent portions and opaque portions are reversed. In other embodiments, the photomasks can include multiple transparent portions corresponding to multiple features on a part.

As shown in FIGS. 2A and 2B, transparent portions 202 and 222 have slightly different shapes in order to accurately correspond to slightly different shapes of features 212 and 232 of parts 210 and 230, respectively. In a sense, adaptive photomask 200 can act as a configurable aperture that dynamically adjusts to different sizes and shapes of different features 212 and 232. That is, photomask 200 is adaptive in that it can provide a customized pattern of transmissive and opaque portions. In this way, photomask 200 can accommodate the slightly different dimensions of feature 212 of part 210 and feature 232 of part 230. Photomask 200 can be any suitable photomask capable of providing changeable opaque and transmissive portions. In some embodiments, photomask 200 includes a changeable medium made of substantially transparent material, such as transparent glass or plastic, which has a number of selectively transmissive elements. Each of the selectively transmissive elements can be in a transmissive state that allows energy to pass through or an opaque state that blocks energy from passing through. In some embodiments, the selective transmissive elements can transition between a transmissive state and an opaque state in response to an applied voltage. In some embodiments, the changeable medium is pixilated with each pixel corresponding to a selectively transparent element. Photomask 200 can be in the form of a pane or a film, or a composite structure made of a number of stacked layers or films. In some embodiments, photomask 200 includes organic light emitting diodes (OLED) like materials that have portions that change opacity in response to an applied voltage. In some embodiments, photomask 200 includes an electrochromic glass, sometimes referred to as smart glass. Portions of the electrochromic glass can change transmission of light when voltage is applied. In one embodiment, the applied voltage can cause particles, such as suspended rod-like particles or liquid crystals, in the electrochromic glass to arrange such that substantially none of the photoresist activating wavelengths of light passes through in opaque portions of the glass.

Figure 3:
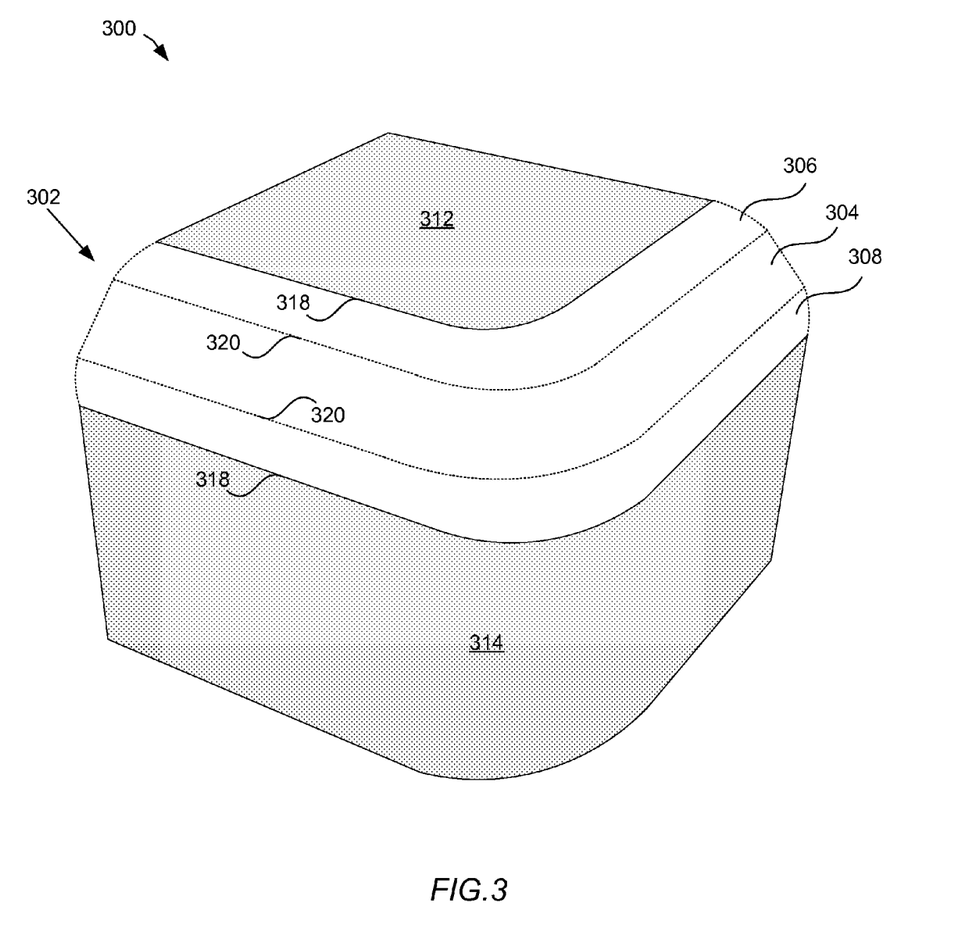
FIG. 3 illustrates a perspective view of a part having a chamfered edge and textured surfaces.

In some cases, the features can include three-dimensional features of a part. FIG. 3 shows a perspective view of part 300 having a chamfered edge 302. As shown, chamfered edge 302 includes flat surface 304 and curved surfaces 306 and 308. Feature boundaries 318 define the borders between chamfered edge 302 and surrounding surfaces 312 and 314. Feature boundaries 320 define the borders between flat surface 304 and curved surface 306 and 308 within chamfered edge 302. Surfaces 312 and 314 are textured surfaces formed by photomasking and texturing techniques similar to those described above for part 100. Surfaces 304, 306 and 308 are masked prior to the texturing process. Because of the three-dimensional characteristics of chamfered edge 302, there can be dimensional variability from part to part in the manufacture of multiple parts similar to part 300. For example, the width of flat portion 304 and curved portions 306 and 308 can vary slightly from part to part. In some cases, the width of portion 304 and curved portions 306 and 308 can vary within part 300. Thus, traditional techniques of using a photomask having a fixed pattern can result in variability of where boundaries of textured surfaces 312 and 314 begin and end.

Figure 4A:
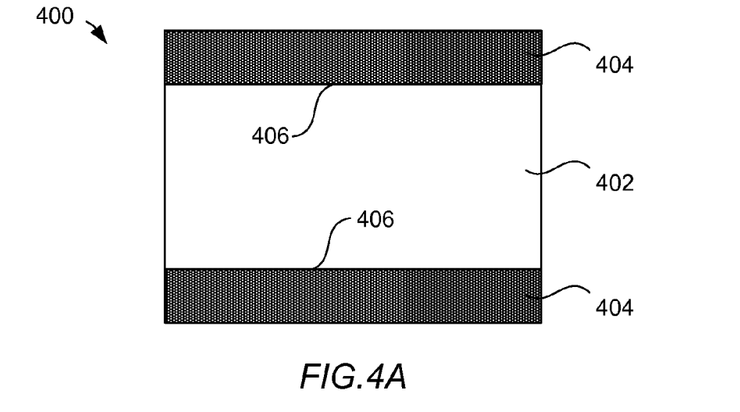
FIGS. 4A-4C illustrate top views of an adaptive photomask used in a photomasking process for a chamfered edge of a part.
Figure 4B:
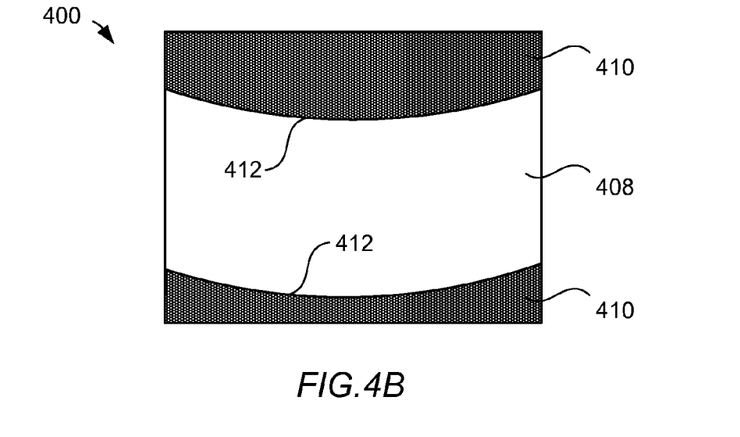
Figure 4C:
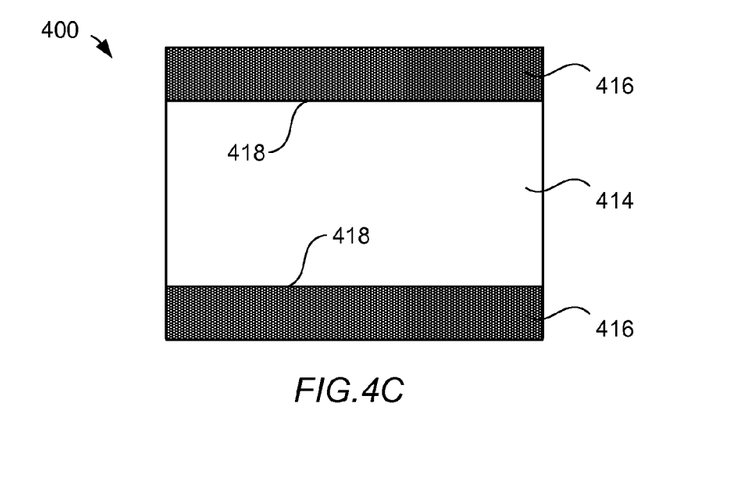

FIGS. 4A-4C show top views of adaptive photomask 400 that can be used in a photomasking process for chamfered edge 302 of part 300 of FIG. 3. Photomask 400 is configured to change states while being moved along chamfered edge 302. At FIG. 4A, photomask 400 is at a first state for exposing a straight edge portion of chamfered edge 302 to light. In the first state, photomask 400 includes transparent portion 402, configured to allow light to pass therethrough, and opaque portions 404, configured to block passage of light. Photomask feature boundaries 406 define the surface area of part 300 that is exposed to light. Note that photomask 400 can be designed to block and let through any suitable wavelengths of light during a photomasking process. In some embodiments, photomask 400 is configured to block and let through UV wavelengths of light.

At FIG. 4B, photomask 400 has been moved to a curved portion of chamfered edge 302 and is at a second state for exposing part 300 to light. In the second state, photomask 400 includes transparent portion 408, configured to allow light to pass therethrough, and opaque portions 410, configured to block passage of light. Photomask feature boundaries 412 define the surface area of part 300 that is exposed to light. At FIG. 4C, photomask 400 has been moved to another straight portion of chamfered edge and is at a third state for exposing part 300 to light. In the third state, photomask 400 includes transparent portion 414, configured to allow light to pass therethrough, and opaque portions 416, configured to block passage of light. Photomask feature boundaries 418 define the surface area of part 300 that is exposed to light.

Photomask feature boundaries 406, 412 and 418 can be configured to align with feature boundaries 318 along chamfered edge 302 of part 300. In this way, photoresist that covers curved portions 306 and 308 and straight portion 304 will be exposed to light and remain after a photoresist chemical treatment process. Part 300 can then undergo a texturing process to form textured surfaces on surfaces 312 and 314. If dimensions of feature boundaries 318 vary along chamfered edge 302, photomask feature boundaries 406, 412 and 418 can be adjusted accordingly. In this way, the boundaries of the textured surfaces 312 and 314 can be aligned precisely with feature boundaries 318. In alternative embodiments, the photomask feature boundaries 406, 412 and 418 can be chosen to align with other features of part 300. For example, feature boundaries 320 can be used as a basis of forming photomask feature boundaries 406, 412 and 418. In these embodiments, only flat portion 304 of chamfered edge 302 can be masked during the texturing process, thereby forming textured surfaces on curved surfaces 306 and 308, as well as surrounding surfaces 312 and 314.

Figure 5:
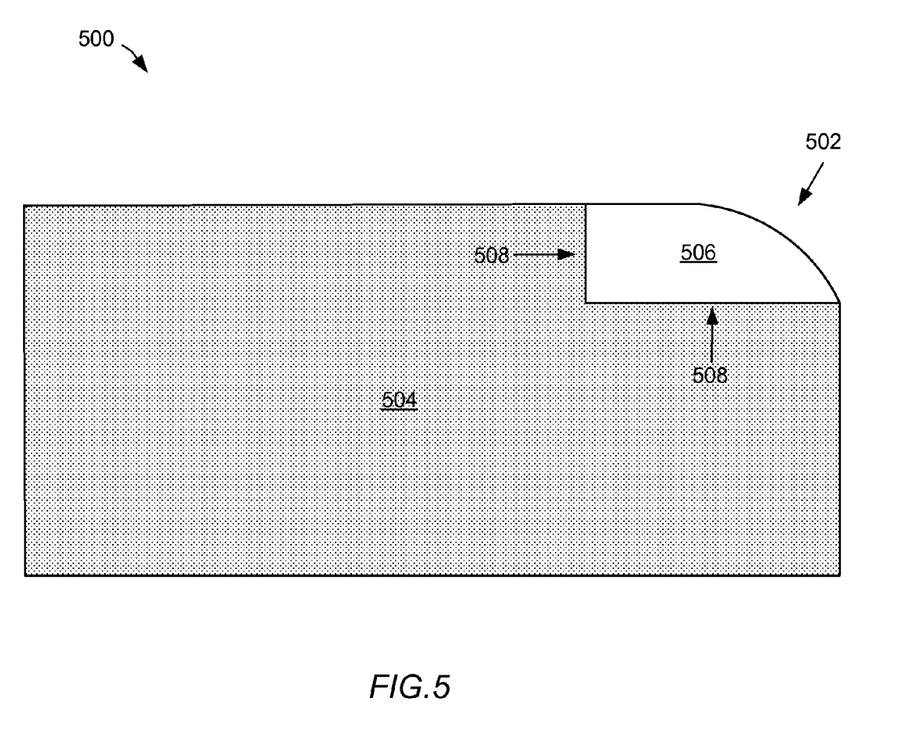
FIG. 5 illustrates a side view of a part having a surface feature located at a curved edge of a part.

In some cases, a part can include a feature that exists on a three-dimensional surface. FIG. 5 shows a side view of part 500 having feature 506 and surrounding surface 504. In some embodiments, feature 506 and surrounding surface 504 are made of different materials. In one embodiment, feature 506 is made of a plastic or ceramic material and surrounding surface 504 is made of a metal material. In some embodiments, surrounding surface 504 has is textured from a texturing process and feature 506 has a smooth and polished surface. The combination of textured and smooth surfaces can be producing using a photomasking process similar to that described above with reference to FIGS. 1-4. As shown, feature 506 is located along edge 502 of part 500 and is define by feature boundary 508. Since feature 506 is located at a curved surface of part 500, the dimensions of boundary 508 can substantially vary from part to part due to manufacturing tolerance. Thus, traditional photomasking techniques using a fixed photomask pattern can result in parts having a textured surface boundary that does not align with feature boundary 508. The adaptive photomasks and methods described herein allow for precise alignment of the textured surface boundary and feature boundary 508.

According to some embodiments, the adaptive photomask is part of a photomasking system, which can include one or more image capturing devices for capturing images of the surface of the part. In some embodiments, the photomasking system also includes a translational mechanism configured to move the photomasking system along a surface of the part.

Figure 6A:
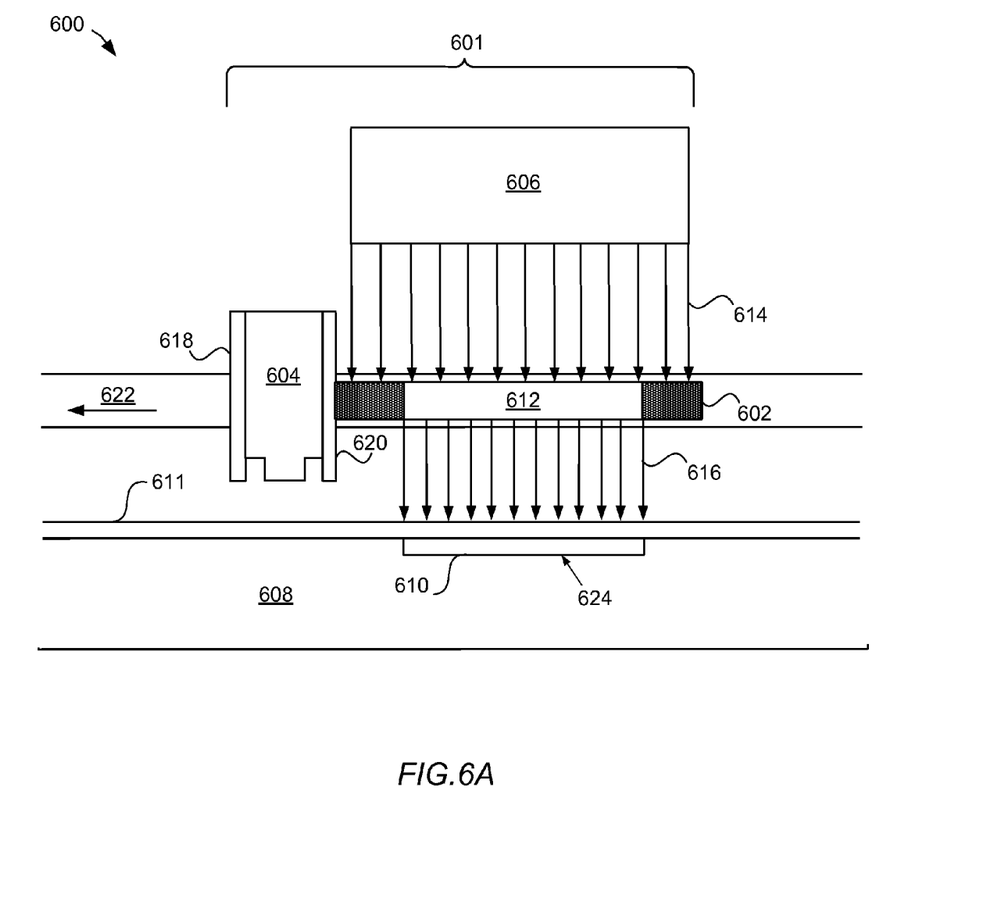
FIGS. 6A-6C illustrate various views of a photomasking system that includes an adaptive photomask.
Figure 6B:
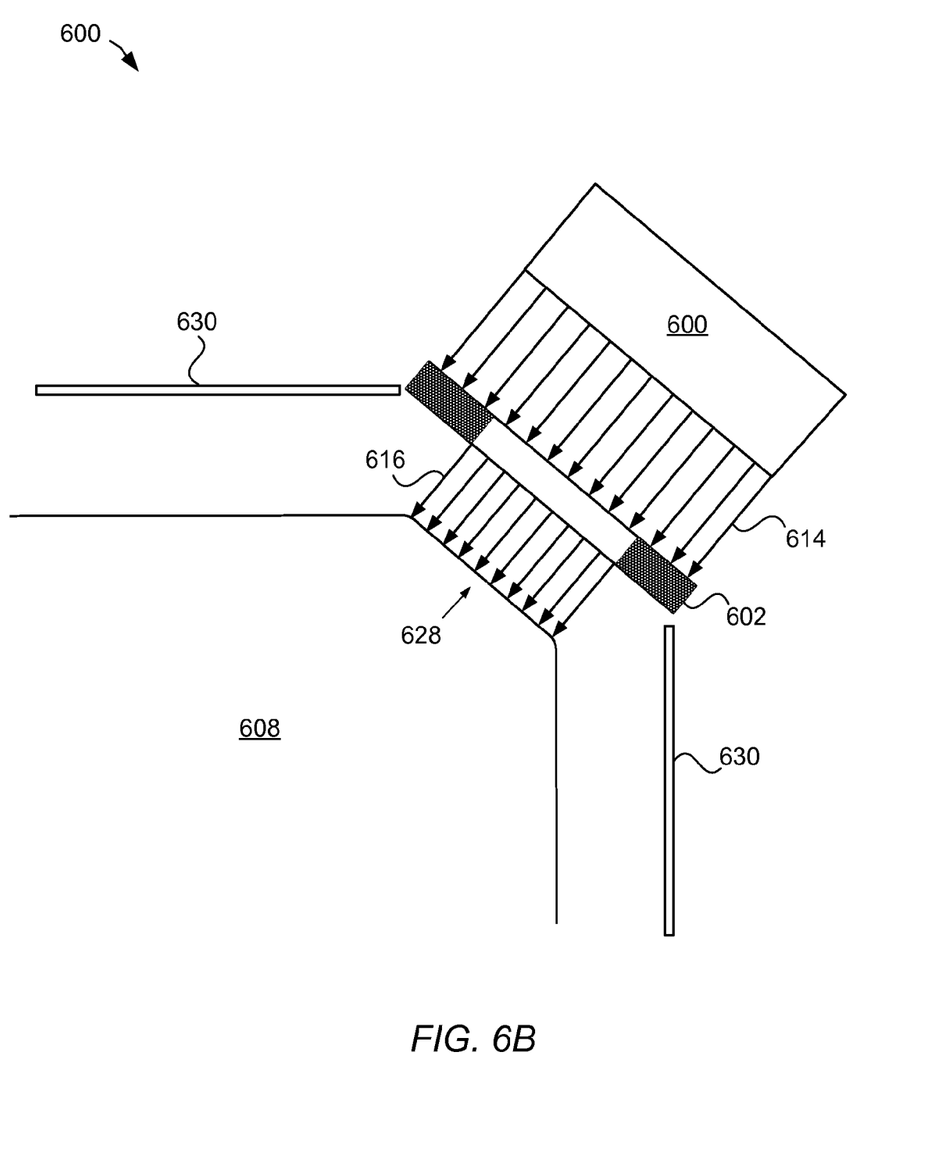
Figure 6C:
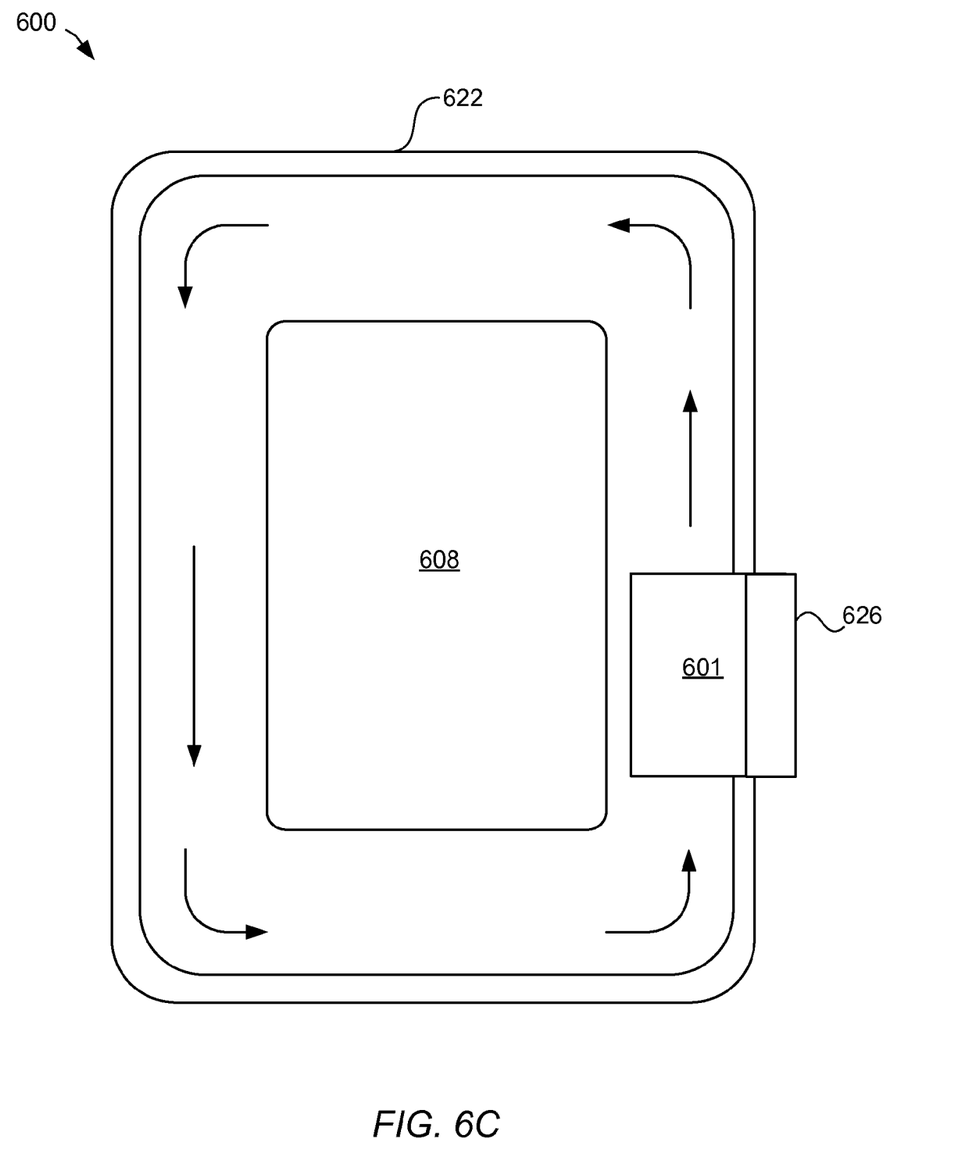

FIGS. 6A-6C show various views of photomasking system 600 in accordance with described embodiments. FIG. 6A shows a front view of adaptive photomasking system 600, which includes a photomasking unit 601. Photomasking unit 601 can include adaptive photomask 602, image capturing device 604, and light source 606. In some embodiments, light source 606 is a UV light source configured to generate UV wavelengths of light. Light 614 from light source 606 can shine through transparent portion 612 of adaptive photomask 602 in a pattern of light 616 onto a surface of part 608. Part 608 includes feature 610 that has feature boundary 624. Image capturing device 604 is configured to capture image data associated with a surface of part 608, including feature boundary 624 of feature 610. Image capturing device 604 can be any suitable device capable of capturing image data associated with feature 610. In some embodiments, image capturing device 604 can include a charge-coupled device (CCD) image sensor or a complementary metal-oxide-semiconductor (CMOS) image sensor. Image capturing device 604 can capture the image and convert it into electrical signals, which can then be used to create a corresponding pattern of opaque and transparent portions on adaptive photomask 602. Image capturing device 604 can also include a memory storage device for storing the image data, including dimensional data associated with feature boundary 624.

During a photomasking process, adaptive photomasking unit 601 can move along a surface of part 608 using a translational mechanism. The translational mechanism can include a motor mechanism (not shown) that moves photomasking unit 601 along track 622. Photomasking unit 601 and track 622 are positioned relative to part 608 such that photomasking unit 601 follows a scan path above a surface of part 608. In some embodiments, photomasking unit 601 continuously moves or scans above a surface of part 608. In other embodiments, photomasking unit 601 stops at certain sections, such as those sections that have features, to collect image data and expose photoresist 611 to light. In some embodiments, adaptive photomasking unit 601 includes proximity sensor 618, which can detect and collect proximity data regarding the proximity of the surface of part 608 during movement along track 622. The proximity data can be used in conjunction with the translational mechanism to adjust movement of photomasking unit 601. In some embodiments, adaptive photomasking unit 601 includes linear actuator 620, which can direct linear translational movement of photomasking unit 601 along track 622.

In some embodiments, adaptive photomasking unit 601 is scanned across the surface of part 608 at least two times during a photomasking process. During the first scan, photomasking unit 601 moves over the surface of part 608 while image capturing device 604 captures and stores image data. Next, the surface of part 608 is covered with photoresist 611. During the second scan, photomasking unit 601 moves over the surface of part 608 along the same path as the first scan during an exposure process. During the exposure process, adaptive photomask 602 produces a custom pattern of opaque and transparent 612 portions based on the image data while light source 606 shines light through transparent portion 612. As a result, portions of photoresist 611 that are positioned over feature 610 and have the same dimensions as feature boundary 624 are exposed to light. In this way, precise masking of feature 610 can be accomplished.

In an alternative embodiment, adaptive photomasking unit 601 is scanned across the surface of part 608 one time during a photomasking process. That is, the image capturing and light exposure occur during one scan. In these embodiments, photoresist 611 covers part 608 prior to the scan. The photoresist can be sufficiently transparent or semi-transparent such that image data associated with feature 610 can be detected by image capturing device 604. During the scan, image capturing device 604 captures the image data, which is transferred to adaptive photomask 602. Adaptive photomask 602 produces a custom pattern of opaque and transparent 612 portions based on the image data while light source 606 shines light through transparent portion 612. As a result, portions of photoresist 611 that are positioned over feature 610 and have the same dimensions as feature boundary 624 are exposed to light. In this way, precise masking of feature 610 can be accomplished in one scan of photomasking unit 601.

FIG. 6B shows a side view of photomasking unit 601 exposing a chamfered edge 628 of part 608. In some embodiments, shields 630 can be positioned proximate to photomasking unit 601 to prevent stray light from impinging on other surfaces of part 608. FIG. 6C shows a top view of adaptive photomasking system 600. As shown, photomasking unit 601 can be situated on track 622 to follow a surface of part 608 during a scanning operation. In one embodiment, track 622 and photomasking unit 601 can be configured to follow a perimeter surface of 608. Motor mechanism 626 can move adaptive photomasking system 600 along track 622.

Figure 7:
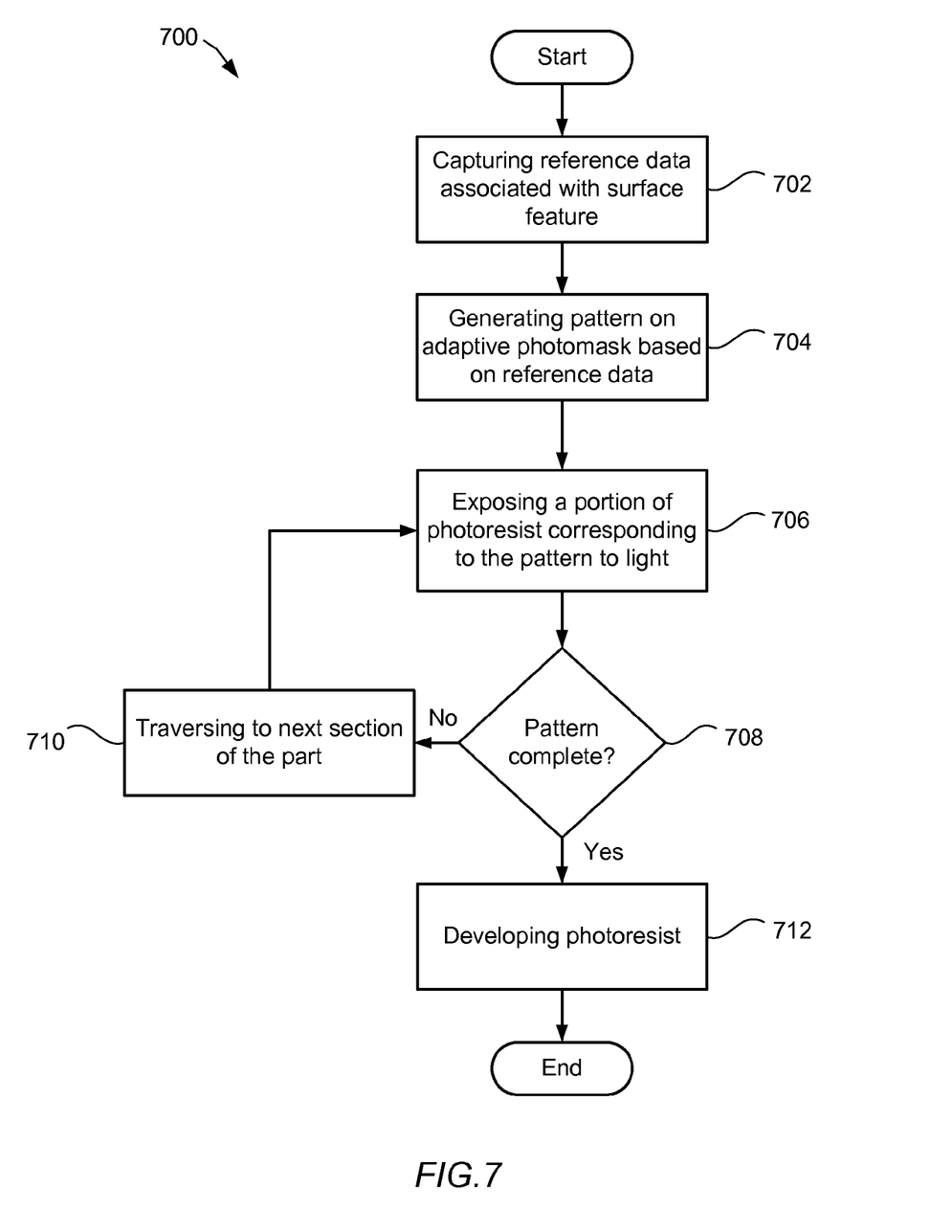
FIG. 7 illustrates a flowchart indicating a photomasking process using an adaptive photomask.

FIG. 7 shows flowchart 700 indicating a photomasking process in accordance with described embodiments. At 702, reference data (e.g., dimensional data) associated with a feature on a surface of a part is captured. The reference data can be captured using an image capturing device. The image capturing device can include a CCD or CMOS image sensor. The reference data can be stored on a storage medium of the image capturing device. In some embodiments, the part has an overlaying film of photoresist when the reference data is captured. In other embodiments, the reference data is captured prior to forming the photoresist layer on surface of the part. At 704, a pattern based on the reference data is generated on an adaptive photomask. The pattern can be displayed as a digitized image, such a pattern of darkened pixels of a pixilated transparent material. That is, a portion of the pixels can be darkened to substantially block passage of light in response to receiving the reference data. In some embodiment, the reference data can be sent by the image capturing device and received by a processor associated with the adaptive photomask that instructs the adaptive photomask to generate the digitized pattern. At 706, a portion of photoresist corresponding to the pattern is exposed to light by shining light through transparent portions of the pattern of the adaptive photomask. If a negative photoresist is used, those portions exposed to light will remain on the substrate surface after a subsequent photoresist development process. If a positive photoresist is used, those portions exposed to light will be removed from the substrate surface after a subsequent photoresist development process. As described above with reference to FIGS. 6A-6C, a photomasking system that includes a translational mechanism can be used to displace the image capturing device and move the adaptive photomask to a position directly over the portion of the part for the light exposure.

At 708, a determination is made as to whether the patterning of the photoresist is complete. Typically, patterning the photoresist is complete when those portions of the photoresist corresponding to the complete pattern of the adaptive photomask have been exposed to light. If it is determined that the patterning is complete, at 712 the photoresist is developed to remove portions of the photoresist that are not used for masking. Those portions of the photoresist remaining have a pattern corresponding to the pattern of the adaptive photomask. The part can then undergo any of a number of surface treatments to provide a surface quality to unmasked portions of the part. If it is determined that the patterning of the photoresist is not complete, at 710 the adaptive photomask is traversed to the next section of the part. Then, at 706 the next section of the part is exposed to another portion of the pattern of light. Steps 706, 708 and 710 are repeated until the patterning of the photoresist is complete.

Figure 8:
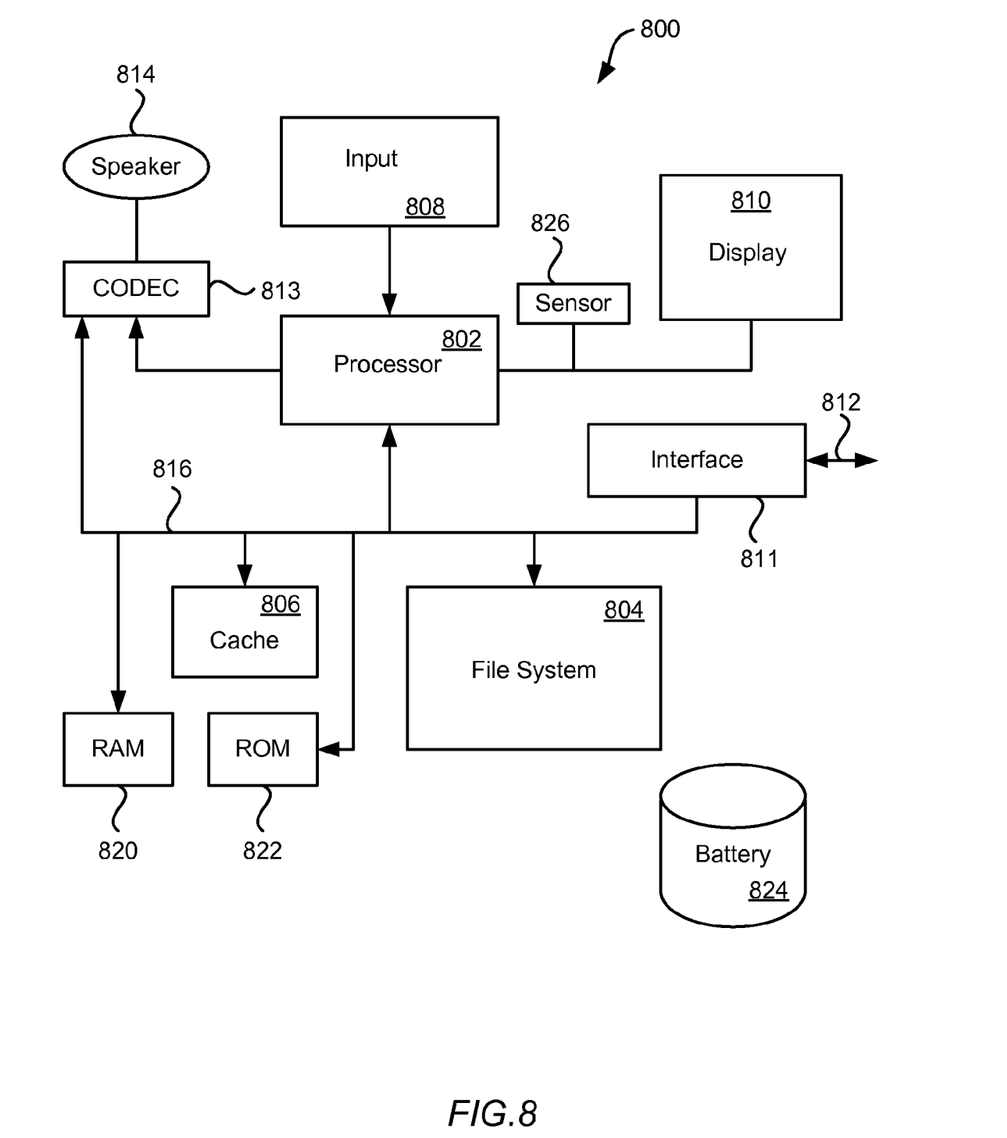
FIG. 8 illustrates a block diagram of an electronic device suitable for use with an adaptive photomasking system.

The described embodiments can be embodied as computer readable code on a non-transitory computer readable medium for controlling manufacturing operations or as computer readable code on a non-transitory computer readable medium for controlling a manufacturing line. FIG. 8 is a block diagram of electronic device 800 suitable for controlling some of the processes in the described embodiment. Electronic device 800 illustrates circuitry of a representative computing device that can be used during one or more procedures in the photomasking processes described herein. Electronic device 800 includes a processor 802 that pertains to a microprocessor or controller for controlling the overall operation of electronic device 800. Electronic device 800 contains instruction data pertaining to manufacturing instructions in a file system 804 and a cache 806. File system 804 is, typically, a storage disk or a plurality of disks. File system 804 typically provides high capacity storage capability for the electronic device 800. However, since the access time to the file system 804 can be relatively slow, electronic device 800 can also include a cache 806. Cache 806 can be, for example, Random-Access Memory (RAM) provided by semiconductor memory. The relative access time to cache 806 can be substantially shorter than for file system 804. However, cache 806 may not have the large storage capacity of the file system 804. Further, file system 804, when active, can consume more power than cache 806. In some embodiments, electronic device 800 is a portable device powered by battery 824. Electronic device 800 can also include a RAM 820 and/or Read-Only Memory (ROM) 822. ROM 822 can store programs, utilities or processes to be executed in a non-volatile manner. RAM 820 can provide volatile data storage, such as for cache 806.

Electronic device 800 can include user input device 808 that allows a user of electronic device 800 to interact with electronic device 800. User input device 808 can take a variety of forms, such as a button, keypad, dial, touch screen, audio input interface, visual/image capture input interface, input in the form of sensor data, etc. Still further, electronic device 800 can include display 810 (screen display) that can be controlled by the processor 802 to display information to the user. Data bus 816 can facilitate data transfer between at least file system 804, cache 806, processor 802, and coder/decoder (CODEC) 813. CODEC 813 can be used to decode and play a plurality of media items from file system 804 that can correspond to certain activities taking place during a particular manufacturing process. Processor 802, upon a certain manufacturing event occurring, can supply media data (e.g., audio file) for a particular media item to a CODEC 813. CODEC 813 can then produce analog output signals for a speaker 814. Speaker 814 can be a speaker internal to electronic device 800 or external to electronic device 800. For example, headphones or earphones that connect to the electronic device 800 would be considered an external speaker.

Electronic device 800 can also include network/bus interface 811 that couples to data link 812. Data link 812 can allow electronic device 800 to couple to a host computer or to accessory devices. Data link 812 can be provided over a wired connection or a wireless connection. In the case of a wireless connection, network/bus interface 811 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 826 can take the form of circuitry for detecting any number of stimuli. For example, sensor 826 can include any number of sensors for monitoring a manufacturing operation such as for example a Hall Effect sensor responsive to external magnetic field, an audio sensor, a light sensor such as a photometer, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for using a configurable aperture to dynamically activate a corresponding portion of a photoresist layer disposed on a surface of a substrate and associated with a feature on the surface of the substrate, the method comprising:
   (a) receiving dimensional data associated with the feature, the dimensional data including data corresponding to a boundary of the feature, wherein the dimensional data is collected by scanning the surface of the substrate using an image capturing device; and
   (b) adjusting a size and shape of a transmissive portion of the configurable aperture in accordance with the received dimensional data, the transmissive portion allowing energy used to activate a corresponding portion of the photoresist layer to pass.

2. The method as recited in claim 1, wherein the adjusted size and shape of the transmissive portion corresponds with the boundary of the feature.

3. The method as recited in claim 1, wherein scanning the surface of the substrate includes moving the image capturing device in accordance with a scan path along the surface of the substrate.

4. The method as recited in claim 1, wherein the energy is in the form of light.

5. The method as recited in claim 1, wherein the configurable aperture is configured to move along the surface of the substrate.

6. The method as recited in claim 5, wherein the shape and size of the transmissive portion is adjusted as the configurable aperture moves along the surface of the substrate.

7. The method as recited in claim 5, wherein a translation mechanism moves the configurable aperture along the surface of the substrate.

8. The method as recited in claim 1, wherein the configurable aperture has an opaque portion that prevents energy from passing to the photoresist layer, wherein adjusting the size and shape of the transmissive portion comprises adjusting the opaque portion of the configurable aperture.

9. The method as recited in claim 8, wherein adjusting the opaque portion of the configurable aperture comprises darkening a portion of pixels of a pixelated medium.

10. The method as recited in claim 1, wherein the feature is a chamfered edge of the substrate and wherein the boundary corresponds to a boundary between adjacent surfaces of the substrate along the chamfered edge.

11. A method for using an adaptive photomask to dynamically activate a portion of a first photoresist layer disposed on a first part and a second photoresist layer disposed on a second part, the first part having a first surface feature and the second part having a second surface feature, the method comprising:
   receiving a first set of dimensional data associated with the first feature, the first set of dimensional data including data corresponding to a first feature boundary of the first feature, wherein the first set of dimensional data is collected by scanning a surface of the first part using an image capturing device;
   adjusting a size and shape of a transmissive portion of the adaptive photomask in accordance with the received first set of dimensional data, the transmissive portion allowing energy to pass therethrough, activating a portion of the first photoresist layer corresponding to the first feature;
   receiving a second set of dimensional data associated with the second feature, the second set of dimensional data including data corresponding to a second feature boundary of the second feature, wherein the second set of dimensional data is different than the first set of dimensional data, wherein the second set of dimensional data is collected by scanning a surface of the second part using the image capturing device; and
   adjusting a size and shape of the transmissive portion of the adaptive photomask in accordance with the received second set of dimensional data, the transmissive portion allowing used to pass therethrough, activating a portion of the second photoresist layer corresponding to the second feature.

12. The method as recited in claim 11, wherein scanning the surface of the first part includes moving the image capturing device in accordance with a scan path along the surface of the first part, and scanning the surface of the second part includes moving the image capturing device in accordance with the scan path along the surface of the second part.

13. The method as recited in claim 11, wherein the energy is in the form of light.

14. The method as recited in claim 11, wherein the adaptive photomask is configured to move along the surface of the first part and the surface of the second part.

15. The method as recited in claim 14, wherein the shape and size of the transmissive portion is adjusted as the adaptive photomask moves along the surface of the first part or the surface of the second part.

16. The method as recited in claim 11, further comprising:
   after receiving the first set of dimensional data, aligning the transmissive portion with the first feature; and
   after receiving the second set of dimensional data, aligning the transmissive portion with the second feature.

17. The method as recited in claim 11, wherein the first set of dimensional data includes three dimensional data related to three dimensional aspects of the first part and the second set of dimensional data includes three dimensional data related to three dimensional aspects of the second part.

18. An adaptive photomask system configured to dynamically generate a photomask pattern based on a feature on a surface of a substrate, the adaptive photomask system comprising:
   an image capturing device configured to scan the surface of the substrate and collect dimensional data related to a boundary of the feature;
   an adaptive photomask configured to adjust a changeable medium of the adaptive photomask based on the dimensional data, the changeable medium comprising selectively transmissive elements, wherein, when in a transmissive state, the selectively transmissive elements combine to from a transmissive portion that allows light to pass therethrough and activate a corresponding portion of a photoresist layer disposed on the surface of the substrate.

19. The adaptive photomask system as recited in claim 18, wherein the changeable medium is pixelated with each pixel corresponding to a selectively transparent element.

20. The adaptive photomask system recited in claim 18, further comprising:
   a translational mechanism configured to move the image capturing device in accordance with a scan path along the surface of the substrate.

21. The adaptive photomask system as recited in claim 20, wherein the translational mechanism is configured to translate the image capturing device in accordance with the scan path along a three dimensional portion of the substrate.

22. The adaptive photomask as recited in claim 18, wherein the image capturing device and the adaptive photomask are configured to move along the surface of the substrate, wherein a shape of the transmissive portion transforms as the image capturing device and adaptive photomask move along the surface of the substrate.

\* \* \* \* \*